United States Patent [19]

Maaz

[11] 3,919,767

[45] Nov. 18, 1975

[54] ARRANGEMENT FOR MAKING METALLIC CONNECTIONS BETWEEN CIRCUIT POINTS SITUATED IN ONE PLANE

[75] Inventor: Karl Maaz, Nurnberg, Germany

[73] Assignee: Siemens Aktiengesellschaft, Munich, Germany

[22] Filed: Mar. 25, 1974

[21] Appl. No.: 454,697

Related U.S. Application Data

[63] Continuation of Ser. No. 269,839, July 7, 1972, abandoned.

[30] Foreign Application Priority Data

July 27, 1971 Germany.......................... 2137587

[52] U.S. Cl................... 29/628; 29/625; 174/72 B; 317/101 B; 317/101 CE

[51] Int. Cl.²........................................ H01R 43/00

[58] Field of Search......... 29/624, 625, 628, 630 D; 174/68.5, 72 A, 72 B, DIG. 3; 317/101 CM, 101 CC, 101 CE, 122, 101 B, 101 R

[56] References Cited

UNITED STATES PATENTS

| | | | |
|---|---|---|---|
| 2,929,964 | 3/1960 | Rhys-Jones | 174/68.5 UX |
| 3,098,951 | 7/1963 | Ayer et al. | 29/630 D UX |
| 3,108,360 | 10/1963 | Hackler | 317/101 B X |
| 3,200,020 | 8/1965 | Schroeder | 29/625 X |
| 3,411,205 | 11/1968 | McGinley | 29/625 |
| 3,441,805 | 4/1969 | Paulson | 317/101 C |
| 3,544,950 | 12/1970 | Lopez et al. | 29/625 UX |
| 3,708,609 | 1/1973 | Iosue et al. | 29/624 X |
| 3,818,119 | 6/1974 | Sutherland et al. | 29/624 X |

*Primary Examiner*—Lowell A. Larson
*Assistant Examiner*—Joseph A. Walkowski
*Attorney, Agent, or Firm*—Kenyon & Kenyon Reilly Carr & Chapin

[57] ABSTRACT

An arrangement and method of manufacturing a connector for electrical circuit points lying in the same plane, such as occurs with printed circuit boards, is disclosed. The arrangement comprises a plurality of U-shaped comb-like, conducting elements, formed, for example, from etched copper foils, joined together with a layer of insulating material between the conductors. A portion of the conductors are bent to permit their insertion through the support surface of the circuit for soldering and electrical connection between the circuit points.

3 Claims, 3 Drawing Figures

ARRANGEMENT FOR MAKING METALLIC CONNECTIONS BETWEEN CIRCUIT POINTS SITUATED IN ONE PLANE

This is a continuation of application Ser. No. 269,839 filed July 7, 1972, and now abandoned.

BACKGROUND OF THE INVENTION

1. Field of the Invention

The invention concerns an arrangement for making metallic connections between circuit points which are situated in one plane, and are separated from each other by conductors lying in the same plane.

2. Description of the Prior Art

The prior method of manufacturing complicated printed circuits having unavoidable crossovers was to use multi-layer techniques with plated-through holes, or by single-layer techniques with wire jumpers. The last mentioned method is very expensive from a manufacturing point of view and reduces the technical advantage sought from the use of printed circuits.

It is therefore an object of this invention to form a simple arrangement by which it is possible to make metallic connections between circuit points situated in one plane and separated from each other by conductors lying in the same plane, without using individual jumpers.

SUMMARY OF THE INVENTION

According to the invention, the problem of the prior art is solved by providing several U-shaped elements of electrically conductive material mounted between the respective circuit points to be connected, and joined together by insulating material to form a comb-like unit of one or several layers.

The U-shaped parts can, for example, be made of etched copper foil.

BRIEF DESCRIPTION OF THE DRAWINGS

The invention will be explained more fully by reference to the drawings which illustrate various different embodiments and in which.

DESCRIPTION OF THE PREFERRED EMBODIMENTS

Figure 1:
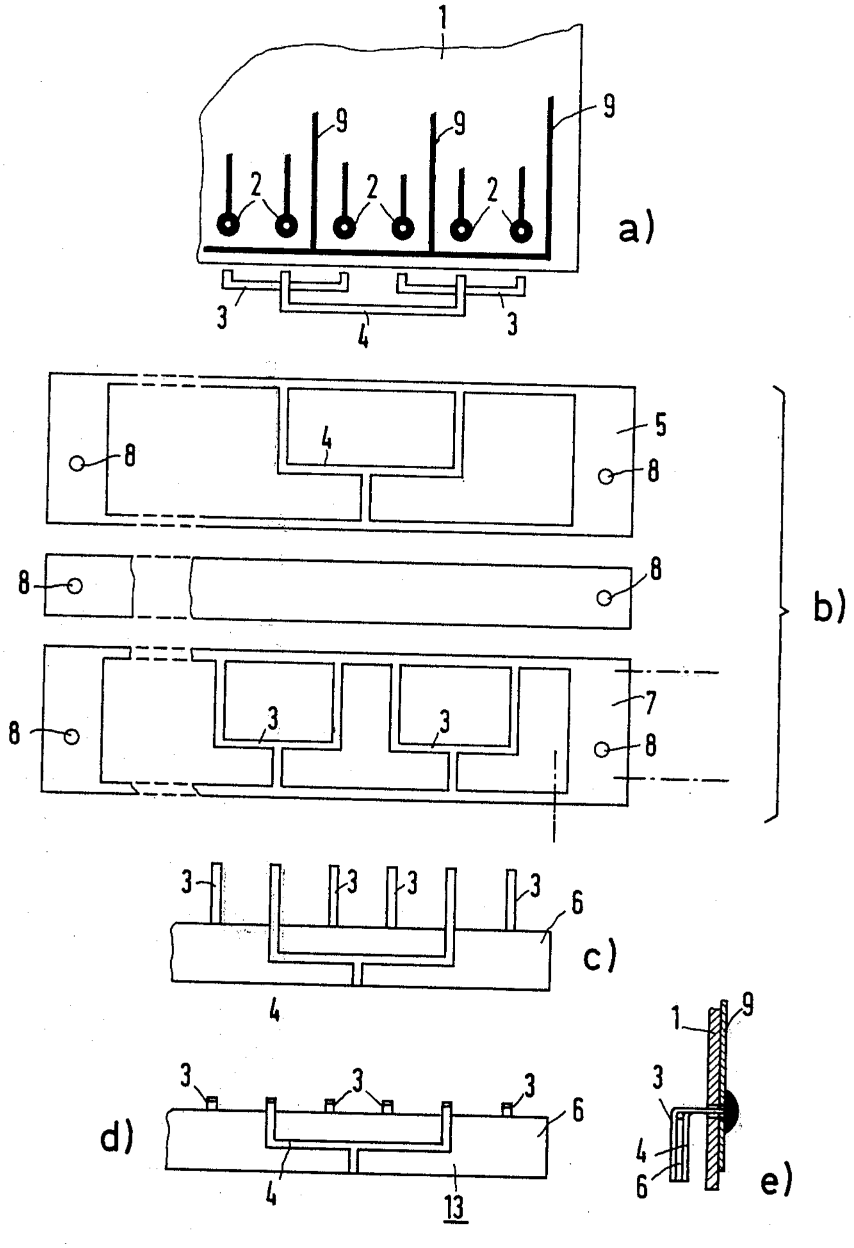
FIG. 1 illustrates a single multi-layer comb arrangement according to the invention.

In FIG. 1a, a section of a printed circuit is shown in which the printed circuit is arranged on a carrier 1. The terminal points 2 of the circuit are to be connected by the jumpers 3 and 4. As the jumpers 3 cross over jumper 4, the jumpers must be arranged in different planes than the plane of the conductors 9 which lie in the same plane as the points 2.

In order to manufacture a device according to the invention, copper foil 5 is substituted for the jumper 4 and copper foil 7 is substituted for the jumper 3 (See FIG. 1*b*). These foils are etched to correspond to the jumpers 3 and 4. The etched copper foils are then tinned by electro-plating and a sheet of insulating material 6 is placed between the two copper foils 5 and 7 in such a manner that the holes 8 of the foils coincide. The sheet of insulating material 6 acts as an intermediate layer. All three foils are then cemented together. Subsequently, the laminated foils are cut along the direction of the dot-dash lines shown in FIG. 1*b*. When so cut one obtains, as an embodiment of the invention, the double-layer comb illustrated in FIG. 1*c*. The tines of the comb are then bent upward as illustrated in FIG. 1*d* and the finished arrangement according to FIG. 1*d* is subsequently inserted into the carrier plate 1 and soldered to the circuit points to be connected and shown in FIG. 1*e*.

Figure 2:
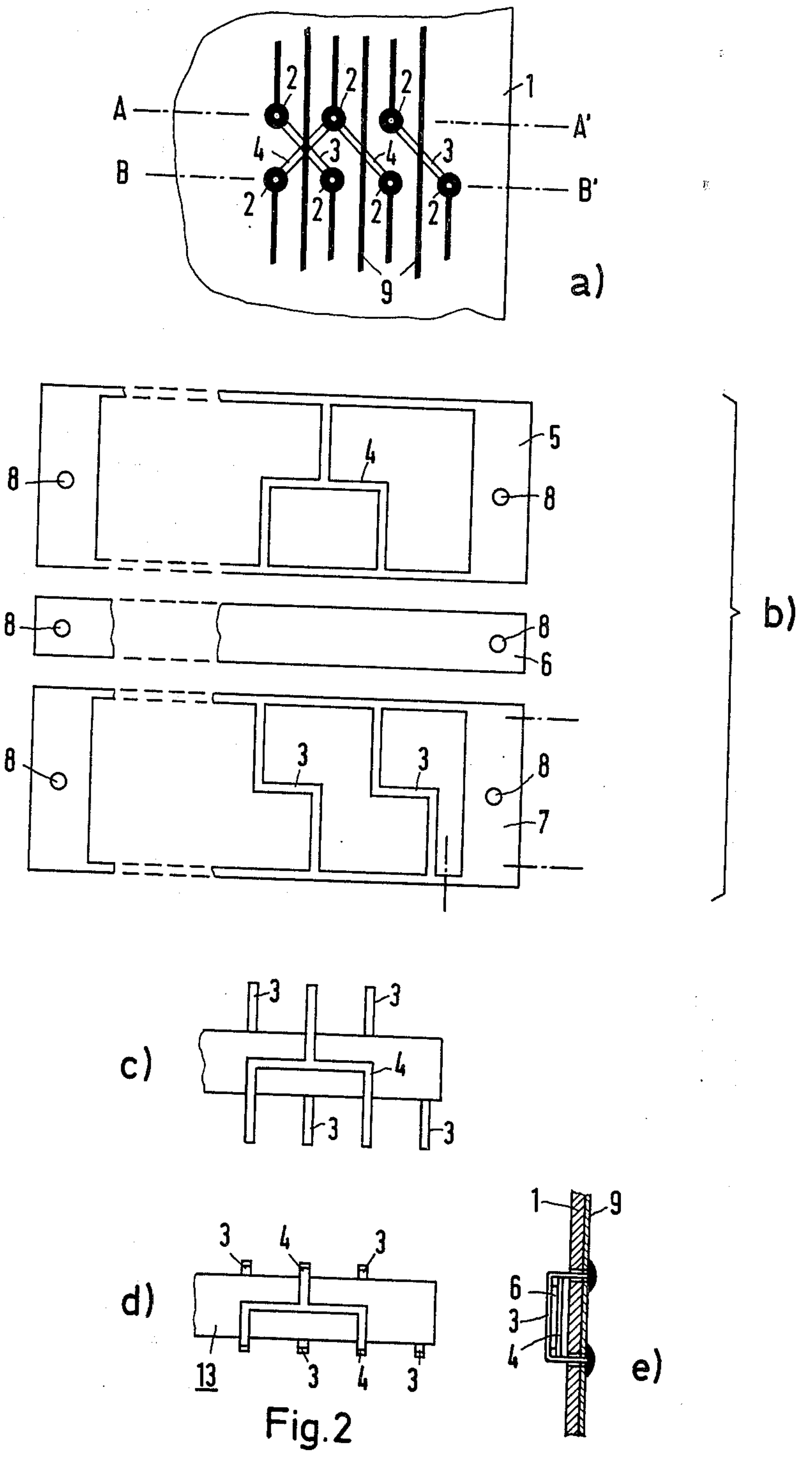
FIG. 2 illustrates a double multi-layer comb arrangement according to the invention.

FIG. 2 shows an embodiment of the invention suitable for making metallic cross over connections between circuit points 2 and 3 of a printed circuit, wherein the cross over circuit points are arranged on the parallel lines A – A′ and B – B′ (FIG. 2*a*). The required jumpers are indicated by 3 and 4 and the conductors 9 separate the circuit points from each other. FIG. 2*b* illustrates the necessary steps in the manufacture of the arrangement according to the invention. The procedure is the same as was already described in connection with FIG. 1*b*. Similar parts are designated with the same reference numbers. After laminating the copper foils 5 and 7 with the insulating material foil 6 between the two foils and subsequently cutting along the dot-dash lines, a double comb as illustrated in FIG. 2*c* is produced. The U-shaped parts 3 and 4 form the jumpers. The tines of the double comb are then bent upward as shown in FIG. 2*d* and the double comb, consisting of the jumpers 3 and 4, separated from each other by the insulating material 6, is then inserted through the conductor plate 1 and soldered to the circuit points as illustrated in FIG. 2*e*.

Figure 3:
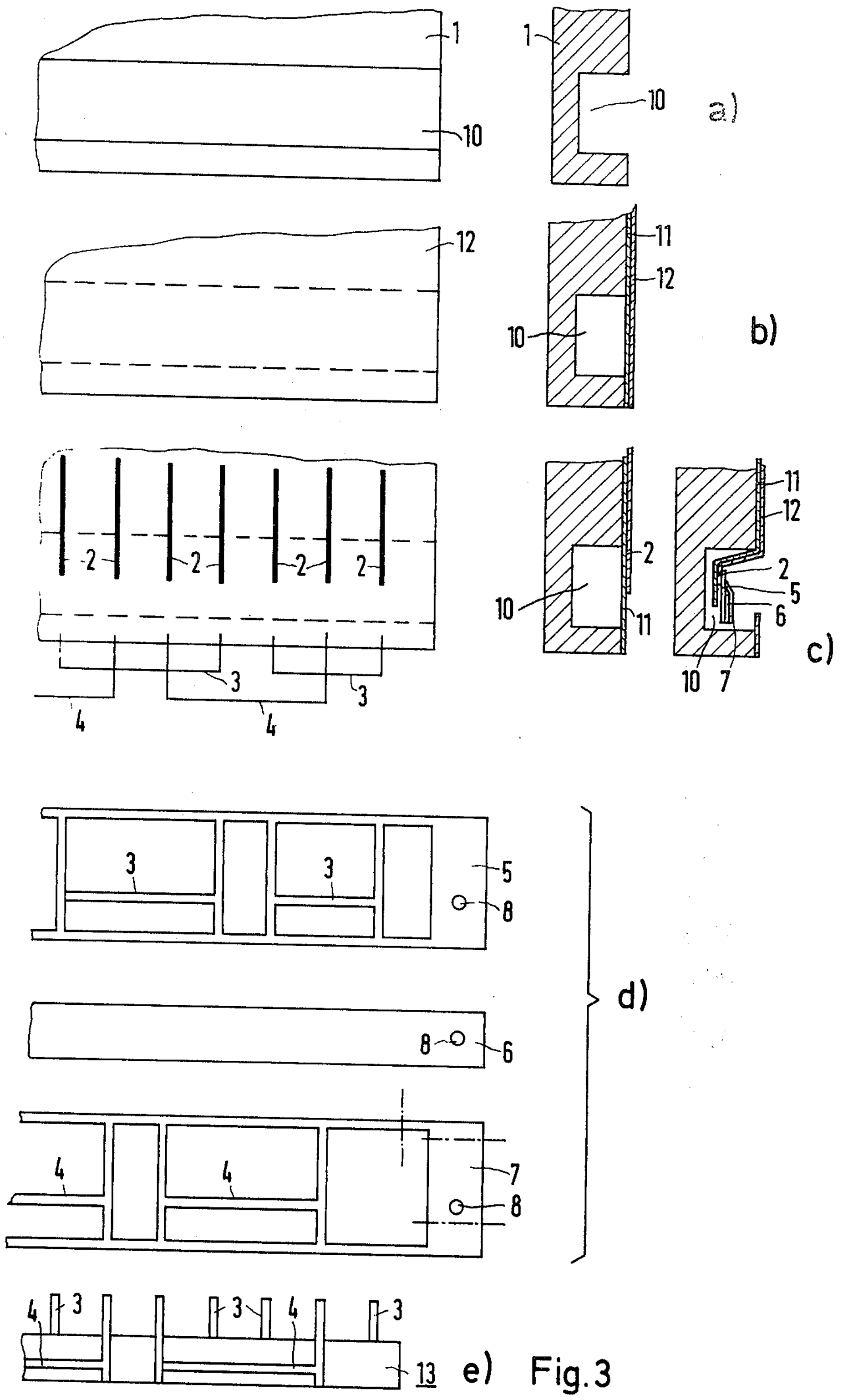
FIG. 3 illustrates a multi-layer recessed comb arrangement according to the invention.

FIG. 3 schematically represents another further example of an embodiment of the invention. It illustrates a printed circuit whose terminal points are to be connected metallically in a predetermined manner by means of a multi-layer comb which is here arranged in a recessed manner. The carrier 1 (FIG. 3*a*) is equipped with a slot 10. The carrier 1 is clad with an insulating foil 11 and a copper foil 12 (FIG. 3*b*) in such a manner that the slot 10 is covered. A printed circuit is made by known methods from the copper foil. The ends to be crossed over are situated over slot 10 shown in FIG. 3*c*. After the insulating foil is appropriately cut, the ends 2 with the exposed insulating foil 11 are folded into the slot 10 and the ends 2 are connected with the tines of the multi-layer comb made from the foils 5, 6 and 7 shown in FIG.3*d*. FIG. 3*e* shows a top view of the finished multi-layer comb.

In the foregoing, the invention has been described in reference to specific exemplary embodiments. It will be evident, however, that variations and modifications, as well as the substitution of equivalent constructions and arrangements for those shown for illustration, may be made without departing from the broader scope and spirit of the invention as set forth in the appended claims. The specification and drawings are accordingly to be regarded in an illustrative rather than in a restrictive sense.

I claim:

1. A method for manufacturing metallic electric connectors for circuit points lying in the same plane on a carrier plate, comprising the steps of:

a. preparing first and second rectangular copper foils of equal size;

b. etching central portions of said first and second copper foils to form conductive paths which cross each other when aligned, said etching being controlled so that said paths are contained within a solid rectangular border at the edges of said rectangular foil;

c. tinning said etched copper foils;

d. inseting a rectangular sheet of insulating material having a length essentially the same as said foils and having a width substantially narrower than that of said foils between the etched copper foils so that the long edges of said foils extend out from said insulating material;

e. cementing said copper foils to said insulating material;

f. cutting away the exposed borders on both sides of said insulating material to form a layered comb, the tines of which form the conduction paths between circuit points; and g. bending the tines for insertion into openings in a carrier plate to permit soldering and connecting of the circuit points.

2. The method according to claim 1, wherein said step of etching comprises etching U-shaped conductive paths on said copper foils.

3. The method according to claim 1, further including the step of forming alignment holes in each of said first and second foils and said insulation material at each end thereof.

* * * * *